(12) United States Patent
Grube et al.

(10) Patent No.: US 6,307,161 B1
(45) Date of Patent: *Oct. 23, 2001

(54) PARTIALLY-OVERCOATED ELONGATE CONTACT STRUCTURES

(75) Inventors: Gary W. Grube, Pleasanton; Igor Y. Khandros, Orinda; Gaetan L. Mathieu, Livermore, all of CA (US)

(73) Assignee: FormFactor, Inc., Livermore, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/926,898

(22) Filed: Sep. 10, 1997

Related U.S. Application Data (60) Provisional application No. 60/025,707, filed on Sep. 10, 1996.

(51) Int. Cl.[7] ................................................ H05K 1/16
(52) U.S. Cl. ........................ 174/260; 174/267; 361/774
(58) Field of Search .................................. 174/267, 263, 174/265, 260; 361/769, 772, 774, 776, 779, 791; 257/692, 693, 694, 695, 696, 697

(56) References Cited

U.S. PATENT DOCUMENTS

| | | | | |
|---|---|---|---|---|
| 3,260,791 | * | 7/1966 | Shelley | 174/267 |
| 3,375,323 | * | 3/1968 | Mayhew | 174/267 |
| 5,041,901 | * | 8/1991 | Kitano et al. | 257/779 |
| 5,067,007 | * | 11/1991 | Kanji et al. | 257/701 |
| 5,334,804 | * | 8/1994 | Love et al. | 174/267 |

* cited by examiner

Primary Examiner—Kamand Cuneo
(74) Attorney, Agent, or Firm—David Larwood; Stuart L. Merkadeau; N. Kenneth Burraston

(57) ABSTRACT

Elongate contact structures (interconnection elements) are formed on electronic components by bonding one (proximal) end of a core element to a terminal of the electronic component and applying a metallic material over the end portion of the core element. The metallic material may also cover a distal end portion of the core element. A central portion of the core element is not covered by the metallic material, but is preferably covered by a masking (insulating) material.

10 Claims, 4 Drawing Sheets

PARTIALLY-OVERCOATED ELONGATE CONTACT STRUCTURES

CROSS-REFERENCE TO RELATED CASES

This is a continuation-in-part of commonly-owned, copending U.S. Provisional Patent Application No. 60/025,707 filed Sep. 10,1996, incorporated by reference herein.

Reference is made to the following commonly-owned, US and PCT patents and patent applications, all of which are incorporated by reference herein: U.S. Pat. No. 5,476,211, issued Dec. 19, 1995; 08/457,479, filed Jun. 1, 1995 (status: pending); 08/570,230, filed Dec. 11, 1995 (status: pending); 08/340,144, filed Nov. 15, 1994 (status: pending); PCT/94/13373, filed Nov. 16, 1994 (status: pending); 08/452,255, filed May 26, 1995 (status: pending); PCT/95/14909, filed Nov. 13, 1995 (status: pending); 08/558,332, filed Nov. 15, 1995 (status: prosecution closed); PCT/95/14885, filed Nov. 15, 1995 (status: pending); U.S. Pat. No. 5,601,740, issued Feb. 11, 1997; 08/788,740, filed Jan. 24, 1997 (status: pending); PCT/96/08107, filed May 24, 1996 (status: pending); 08/819,464, filed Mar. 17, 1997 (status: pending); and PCT/97/08606, filed May 15, 1997 (status: pending).

FIELD OF THE INVENTION

The invention relates to interconnection elements (contact structures) for electronic components and, more particularly to interconnection elements for making electrical connections to microminiature electronic components.

BACKGROUND OF THE INVENTION

As is described in one or more of the above-referenced patent applications, elongate interconnection elements (contact structures) extending from a one electronic component (e.g., a semiconductor device) can be used to make electrical connections to terminals of another electronic component (e.g., a printed circuit board).

These connections can be of a "permanent" nature (e.g., soldered connections) or of a "temporary" nature (e.g., pressure connections). In many of the above-referenced patent applications, elongate interconnection elements which are resilient, and which are particularly well-suited to making pressure connections between electronic components, are described.

FULLY-OVERCOATED. ELONGATE, RESILIENT CONTACT STRUCTURES

An example of elongate resilient (spring) contact structures which are particularly well-suited to making pressure connections is found in the aforementioned, commonly-owned U.S. Pat. No. 5,476,211. Therein is described methods for making resilient interconnection elements for microelectronics applications involving mounting an end of a flexible elongate core element (e.g., wire "stem" or "skeleton") to a terminal on an electronic component, and overcoating the flexible core element and adjacent surface of the terminal with a "shell" of one or more metallic materials having a predetermined combination of thickness, yield strength and elastic modulus to ensure predetermined force-to-deflection characteristics of the resulting spring contacts. Exemplary materials for the core element include gold. Exemplary materials for the coating include nickel and its alloys. The resulting spring contact element is suitably used to effect pressure, or demountable, connections between two or more electronic components, including semiconductor devices.

Figure 1:
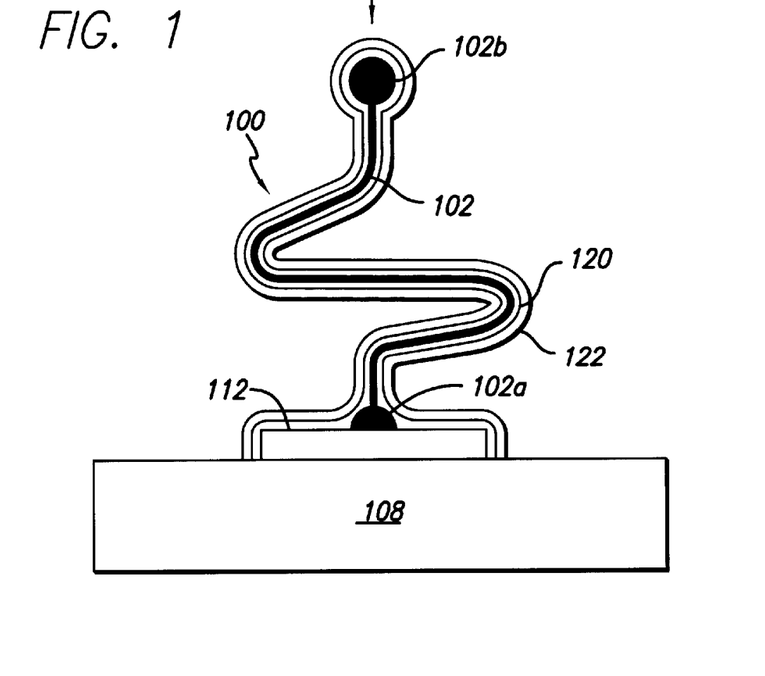
FIG. 1 is a side view of a wire which has been configured to have a shape, and which has been overcoated with multiple layers of material to create a resilient contact structure, such as is disclosed in the aforementioned commonly-owned 08/452,255 and PCT/95/14909.

An example of a resilient contact structure fabricated in the manner set forth immediately hereinabove is shown in FIG. 1, which is comparable to FIG. 5 of the aforementioned 08/452,255 and PCT/95/14909.

FIG. 1 illustrates an exemplary resilient contact structure 100, formed as follows. An elongate core element 102 has had its proximal end 102a bonded to a terminal 112 on an electronic component 108, and is shaped to have a spring-shape, and is severed to have a ball at its distal, free end (tip) 102b. Severing may be accomplished by electronic flameoff (sparking), which may be enhanced in the manner described in commonly-owned U.S. Pat. No. 5,601,740 (issued Feb. 11, 1997).

The core element 102 is formed of a relatively soft (low yield strength) material that will not exhibit a significant amount of resiliency. In order that the resulting spring contact element can be resilient, functioning as a spring and reacting a force (labelled "F") directed axially (i.e, generally in the z-axis direction) downward upon the wire stem, the core element 102 is overcoated, as follows.

One or more layers of metallic material having a relatively high yield strength are applied, such as by plating, onto the core element 102. In the case of multiple layers, the outermost (top) layer is a conductive material. The principal results achieved by overcoating the core element 102 are: (a) imparting a desired degree of resiliency to a resulting contact structure; and (b) securely anchoring the resulting contact structure to the terminal of the electronic component.

FIG. 1 shows that the core element 102 is overcoated with a multi-layer (two layer) coating enveloping (covering the entirety of) the core element 102. A first, inner coating layer 120 covers the core element 102, and a second, outer (top) coating layer 122 covers the first layer 120. The first layer 120 covers the terminal 112 to which the proximal end 102a of the core element 102 is bonded, and securely anchors the core element thereto. The second layer 122 covers the first layer 120 in the area of the terminal 112, and augments anchoring the core element 102 to the terminal 112.

Vis-a-vis the two layers 120 and 122 overcoating the wire stem 102, one (or both) imparts resiliency to the (otherwise non-resilient) wire stem, and the outer layer (or both layers) is electrically conductive. For example:

the core element 102 is a soft gold material, and has a diameter of 0.0007–0.0020 inches (0.7 mils–2.0 mils);

the inner coating 120 is a copper "strike", having a thickness of 5–10 $\mu"$ (microinches); and the outer coating 122 is nickel, and has a thickness of 0.0020 inches.

Generally, a coating such as copper would be chosen for two reasons: (i) to enhance the plating ability of the underlying core element (as is known, certain materials are notoriously difficult to plate, for example with nickel), and/or (ii) to ensure good electrical current carrying characteristics for the resulting overcoated core element (copper is known to be a good conductor of electricity).

Generally, a coating such as nickel, or its alloys, would be chosen for its mechanical characteristics, among which are its high yield strength, to be able to elastically react applied forces, and its ability to firmly anchor the resulting resilient contact structure to the contact area (e.g., terminal).

In some instances, it would be desirable that a top (e.g., third) overcoat layer would provide solderability or the like, and would be galvanically compatible with the material of the contact area. In such instances, for example, a thin top coat hard gold, having a thickness of approximately 100 $\mu"$ (100 micro-inches, 0.0001 inches) would be in order.

In high frequency applications, there would be a tendency for current to be distributed along the outer layer(s) of the coated wire stem. In such a case, gold is a good choice for the outer layer of a multi-layer overcoat.

Figure 1A:
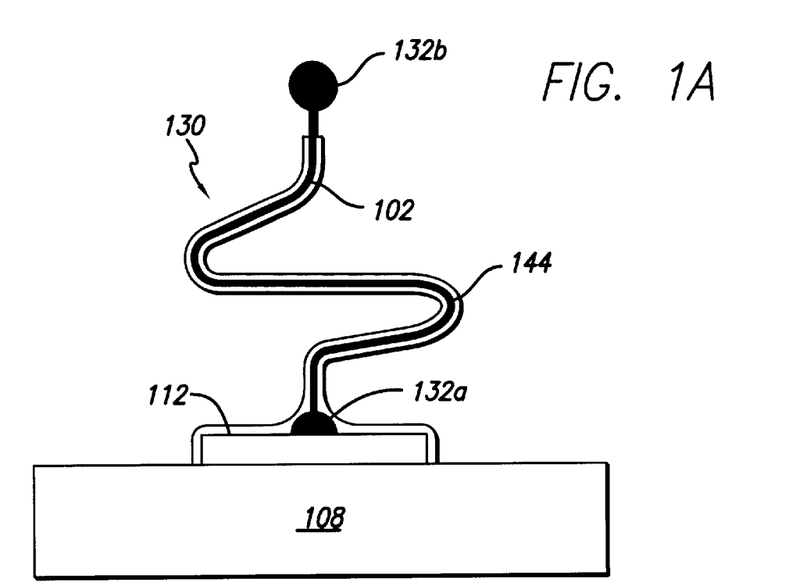

FIG. 1A, which corresponds to FIG. 5B of the aforementioned 08/452,255 and PCT/95/14909, shows a resilient contact structure 130 wherein a core element 132 (compare 102) has only one layer 144 overcoating and jacketing (partially covering) the core element 132, and encompassing the terminal 112 of the component 108. In this case (jacketing), the overcoat layer 144 extends from the proximal (bonded) end 132*a* of the core element 132 only partially towards the distal (free) end 132*b* of the core element 132. This can be accomplished by masking an end portion of the core element 132 which is adjacent the distal end 132*b* of the core element 132 prior to overcoating the core element 132, then overcoating the core element 132, then removing the masking material from the distal end portion of the core element 132. Evidently, if the coating is non-conductive, it is important that the core element 132 itself be electrically conductive.

PACKAGES HAVING ELONGATE RESILIENT CONTACT STRUCTURES

The electronic component to which the interconnection elements (e.g., 100) can be mounted may be an interconnection substrate.

Figure 2:
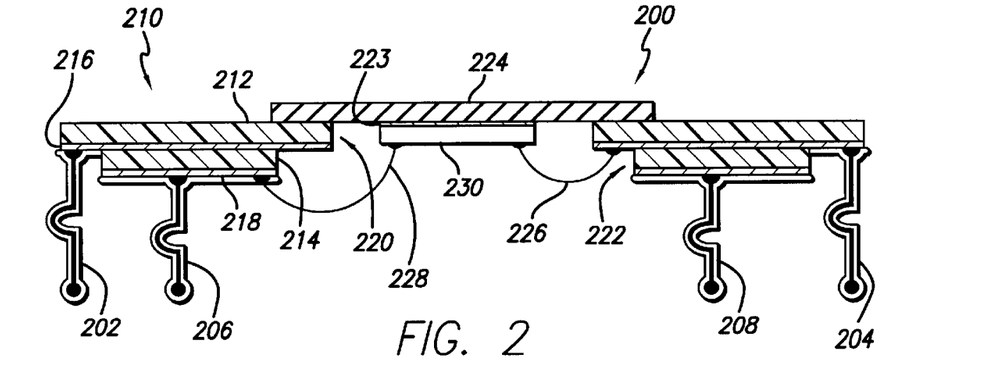
FIG. 2 is a side view of an embodiment of a semiconductor package incorporating resilient contact structures mounted thereto, such as is disclosed in the aforementioned commonly-owned 08/452/255 and PCT/95/14909.

FIG. 2, corresponding to FIG. 23A of the aforementioned 08/452,255 and 95/14909, illustrates an embodiment 200 of a semiconductor package which is based on a multi-layer substrate 210, such as a multi-layer printed circuit board (PCB) substrate.

The multi-layer substrate 210 is illustrated as having two (can be more than two) insulating layers 212 and 214, the layer 212 being disposed atop (as viewed) the layer 214. The bottom surfaces of the layers 212 and 214 are provided with patterned conductive traces 216 and 218, respectively, in a known manner.

The top (as viewed) insulating layer 212 is formed as a square ring, having a central opening 220, and the bottom (as viewed) insulating layer 214 is also formed as a square ring, having a central opening 222 aligned with the central opening 220. As illustrated, the top layer 212 extends beyond the outer (to the left or to the right, as viewed) edges of the bottom layer 214, and the opening 220 is smaller than the opening 222. In this manner, the conductive layer (traces) 216 of the upper layer 212 are exposed.

An electronic component 230 such as a semiconductor device is mounted by a die-attach material 223 (e.g., silver-filled adhesive, or silver-glass composite) to a plate 224. The plate is preferably a metal plate, and is larger than the opening 220. As illustrated, the plate 224 is mounted to the layer 212, on a side of the layer opposite the conductive traces 216, with a suitable adhesive (not shown). In this manner, the semiconductor die 230 is disposed within the opening 220.

Bond wires 226 (one of many shown) are provided between the front (bottom, as viewed) face of the semiconductor die 230 and exposed inner portions of the conductive traces 216. Likewise, bond wires 228 (one of many shown) are provided between the front face of the semiconductor die 230 and inner portions of the conductive traces 218. This is readily accomplished with "standard" wirebonding equipment.

Resilient contact structures 202 and 204 are mounted to exposed portions of the conductive traces 216. Likewise, resilient contact structures 206 and 208 are mounted to exposed portions of the conductive traces 218. It will be understood that each contact structure (202, 204, 206 and 208) is bonded to an individual one of a plurality of conductive traces (216, 218). In this manner, each of the conductive traces is electrically interconnected to a particular one of the bond pads on the face of the semiconductor die, via bond wires (226, 228).

The contact structures 202, 204, 206 and 208 preferably extend to a common height (downward, as viewed in the figure), although they originate from different levels of the PCB 210. Moreover, the contact structures can be shaped (and overcoated) to be resilient.

In the manner described hereinabove, complex interconnections between a semiconductor die (230) and external connections (202, 204, 206, 208) suitable for mounting to a motherboard (or the like) can be effected, without requiring a package having a complex pattern of vias (layer-to-layer conductive paths) which require relatively expensive processing steps.

MOUNTING RESILIENT CONTACT STRUCTURES ON SEMICONDUCTOR DEVICES

FIGS. 3A–3D, comparable to FIGS. 3A–3D of the aforementioned 08/558,332 and PCT/95/14885, illustrate a technique 300 for fabricating resilient contact structures directly upon semiconductor devices.

Figure 3A:
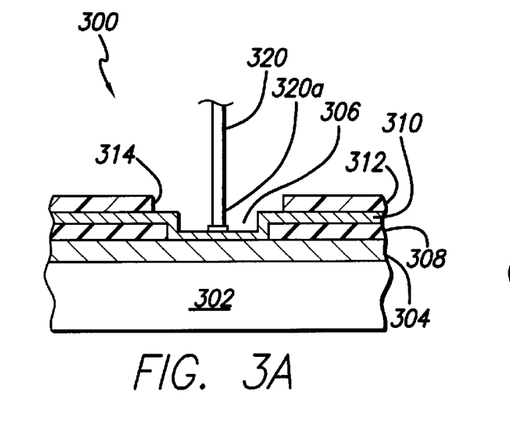
FIG. 3A is a side view of a wire having its free end bonded to a metal layer applied to a substrate, through an opening in a photoresist layer, such as is disclosed in the aforementioned commonly-owned 08/558,332 and PCT/95/14885.

According to conventional semiconductor processing techniques, a semiconductor device 302 has a patterned conductive layer 304. This layer 304 may be a top metal layer, which is normally intended for bond-out to the die, as defined by openings 306 in an insulation (e.g., passivation) layer 308 (typically nitride). In this manner, a bond pad would be defined which would have an area corresponding to the area of the opening 306 in the passivation layer 308. Normally (i.e., according to the prior art), a wire would be bonded to the bond pad.

A blanket layer 310 of metal material (e.g., aluminum) is deposited (such as by sputtering) over the passivation layer 308 in a manner that the conductive layer 310 conformally follows the topography of the layer 308, including "dipping" into the opening 306 and electrically contacting the layer 304. A patterned layer 312 of masking material (e.g., photoresist) is applied over the layer 310 with openings 314 aligned over the openings 306 in the passivation layer 308. Portions of the blanket conductive layer 310 are covered by the masking material 312, other portions of the blanket conductive layer 310 are exposed (not covered) within the openings 314 of the layer of masking material 312. The exposed portions of the blanket conductive layer 310, within the openings 314 will serve as "pads" or "terminals" (compare 214), and may be gold plated (not shown).

An important feature of this technique is that the opening 314 is larger than the opening 306. As will be evident, this will result in a larger bond area (defined by the opening 314) than is otherwise (as defined by the opening 306) present on the semiconductor die 302.

Another important feature of this technique is that the conductive layer 310 acts as a shorting layer to protect the device 302 from damage during a process of electronic flame off (EFO) of the wire stem (core) 320. The conductive layer 310 is also useful in overcoating a core element (320, described hereinbelow) by electroplating.

Figure 3B:
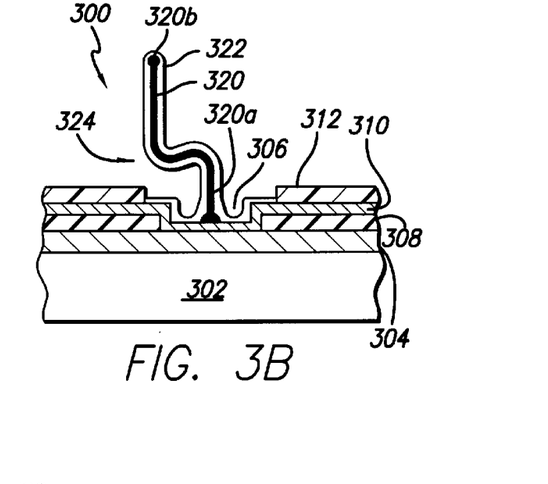
FIG. 3B is a side view of the substrate of FIG. 3A, with the wire overcoated, such as is disclosed in the aforementioned commonly-owned 08/558,332 and PCT/95/14885.

An end 320*a* of an inner core (wire stem) 320 is bonded to the top (as viewed) surface of the conductive layer 310, within the opening 314. The core 320 is configured to extend from the surface of the semiconductor die, to have a springable shape and is severed to have a tip 320b, in the manner described hereinabove (e.g., by electronic flame off). Next, as shown in FIG. 3B, the shaped wire stem 320 is overcoated with one or more layers of conductive material 322, as described hereinabove (compare FIG. 2A). In FIG. 3B it can be seen that the overcoat material 322 completely envelops the wire stem 320 and also covers the conductive layer 310 within the area defined by the opening 314 in the photoresist 312.

The photoresist 312 is then removed (such as by chemical etching, or washing), and the substrate is subjected to selective etching (e.g., chemical etching) to remove all of the material from the conductive layer 310 except that portion 315 (e.g., pad, terminal) of the layer 310 which is covered by the material 322 overcoating the wire stem 320. Portions of the blanket conductive layer 310 previously covered by the masking material 312, and not overcoated with the material 322, are removed in this step, while the remaining portions of the blanket conductive material 310 which have been overcoated by the material 322 are not removed. This results in the structure shown in FIG. 3C, a significant advantage of which is that the resulting composite interconnection element 324 is securely anchored (by the coating material 322) to an area (which was defined by the opening 314 in the photoresist) which can easily be made to be larger than what would otherwise (e.g., in the prior art) be considered to be the contact area of a bond pad (i.e., the opening 306 in the passivation layer 308).

Figure 3C:
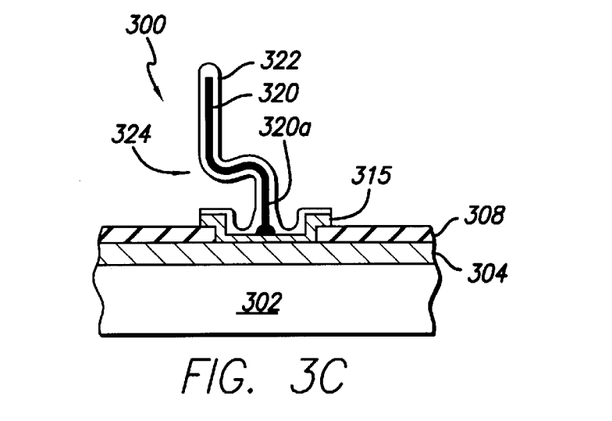
FIG. 3C is a side view of the substrate of FIG. 3B, with the photoresist layer removed and the metal layer partially removed, such as is disclosed in the aforementioned commonly-owned 08/558,332 and PCT/95/14885.

Another important advantage of this technique is that a hermetically-sealed (completely overcoated) connection is effected between the contact structure 324 and the terminal (pad) 315 to which it is mounted.

It is also useful to create openings in the resist (e.g., 314) at locations whereat resilient contact structures are not mounted. Rather, such openings could advantageously be employed to effect connections (such as by traditional wirebonding) to other pads on the same semiconductor die or on other semiconductor dies. This affords the manufacturer the ability to "customize" (route) interconnections with a common layout of openings in the resist.

Figure 3D:
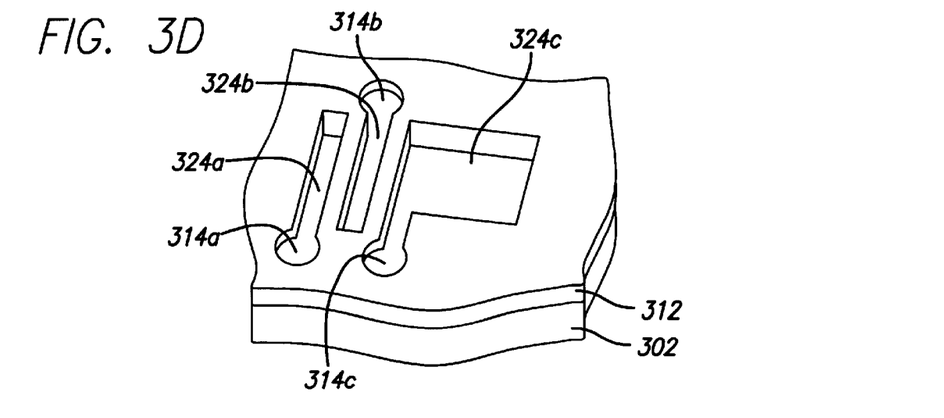
FIG.3D is a perspective view of a semiconductor device, former according to the techniques set forth in FIGS. 3A–3C, such as is disclosed in the aforementioned commonly-owned 08/558,332 and PCT/95/14885.

As shown in FIG. 3D, it is within the scope of this invention that the masking layer 312 can additionally be patterned, so as to leave additional conductive lines or areas upon the face of the semiconductor device 302 (i.e., in addition to providing openings 314 whereat the interconnection elements 324 are mounted and overcoated). This is illustrated in the figure by the "elongate" openings 324a and 324b extending to the openings 314a and 314b, respectively, and the "area" opening 324c optionally (as shown) extending to the opening 314c. (In this figure, elements 304, 308 and 310 are omitted, for illustrative clarity.) As set forth hereinabove, the overcoat material 322 will be deposited in these additional openings (324a, 324b, 324c), and will prevent portions of the conductive layer 310 underlying these openings from being removed. In the case of such elongated and area openings (324a, 324b, 324c) extending to contact openings (314a, 314b, 314c), the elongated and area openings will be electrically connected to corresponding ones of the contact structures. This is useful in the context of providing (routing) conductive traces between (interconnecting) two or more terminals (315) directly upon the face of the electronic component (e.g., semiconductor device) 302. This is also useful for providing ground and/or power planes directly upon the electronic component 302. This is also useful in the context of closely adjacent (e.g., interleaved) elongated areas (which when plated, become lines), such as the elongated areas 324a and 324b, which can serve as on-chip (302) capacitors.

Additionally, providing openings in the masking layer 312 at other than the locations of the contact structures 324 can help uniformize deposition of the subsequent overcoat material 322.

In certain applications, it is not so important that the interconnection elements (contact structures) provide a resilient (spring) pressure connection between two components.

The present invention is similar in some respects to the techniques described hereinabove, and dramatically different in other respects, and relates primarily to making permanent (but reworkable) connections between electronic components, including semiconductor devices, where resilient pressure connections are not required.

In certain microelectronic applications, it would be highly desirable to effect connections, whether permanent or temporary, to semiconductor devices such as memory chips, without the need for first packaging the semiconductor devices. By eliminating the need for first packaging the semiconductor device, a plurality of such devices can be more densely arranged on an interconnection substrate, such as a memory module.

BRIEF DESCRIPTION OF THE INVENTION

It is an object of the invention to provide an improved technique for effecting connections, whether permanent or temporary, to semiconductor devices such as memory chips, without the need for first packaging the semiconductor devices.

It is a further object of the invention to provide a technique for fabricating elongate interconnection elements which are not necessarily resilient contact structures on electronic components.

According to the invention, elongate contact structures (interconnection elements) are formed on electronic components by bonding a one (proximal) end of a core element to a terminal of the electronic component and applying a metallic material over a proximal end portion of the core element. The metallic material may also cover a distal end portion of the core element. A central portion of the core element is not covered by the metallic material, but is preferably covered by a masking (insulating) material.

Generally, portions of the core element that are not masked become covered by the metallic material, and portions of the core element that are masked do not become covered by the metallic material. Generally, the metallic material covering portions of the core element is selected to have a higher yield strength than the material of the core element.

The masking material covering a portion of the core element may initially cover (mask) the entire core element, then be removed from portions (to be covered by metallic material) of the core element. Alternatively, the masking material may be applied only to selected portions of an initially unmasked core element.

Suitable processes for applying the metallic material to the unmasked portions of the core element include, but are not limited to, electroplating and electroless plating. In the case of electroplating, it is desirable that the process include the application of a fugitive shorting layer on the electronic component.

The contact structures of the present invention may also be fabricated on a sacrificial substrate, such as a silicon wafer or an aluminum foil, then transferred to terminals of an electronic component, after which the sacrificial substrate is removed. Techniques for using sacrificial substrates in conjunction with the fabrication of resilient contact structures are disclosed in the aforementioned commonly-owned, copending 08/788,740 and PCT/96/08107, as well as 08/819,464 and 97/08606.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments. Certain elements in selected ones of the drawings are illustrated not-to-scale, for illustrative clarity. Often, similar elements throughout the drawings are referred to by similar references numerals. For example, the element 199 may be similar in many respects to the element 299 in another figure. Also, often, similar elements are referred to with similar numbers in a single drawing. For example, a plurality of elements 199 may be referred to as 199a, 199b, 199c, etc.

DETAILED DESCRIPTION OF THE INVENTION

There have been described, hereinabove, a variety of resilient contact structures (100, 130) and applications (200, 300) for same wherein a relatively soft (low yield strength) core such as a gold wire is mounted to a terminal of a component, then shaped and severed, then overcoated with a relatively hard (high yield strength) material such as nickel to impart resilient characteristics to the resulting contact element and to securely anchor the resulting contact element to the terminal of the electronic component.

The present invention beneficially employs many of the materials and processes appropriate for the techniques described hereinabove, which are described in the following three paragraphs.

Suitable materials for the core element (e.g., 102, 130, 320, 420, 620) include, but are not limited to: gold, aluminum, copper, and their alloys. These materials may be beneficially alloyed with small amounts of other metals to obtain desired physical properties, such as with beryllium, cadmium, silicon, magnesium, and the like. It is also possible to use silver, palladium, platinum; metals or alloys such as metals of the platinum group of elements. Solder constituted from lead, tin, indium, bismuth, cadmium, antimony and their alloys can be used.

Suitable materials for the material (e.g., 120, 122, 144, 322, 424, 624) overcoating the core element include, but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the platinum group and their alloys; tungsten and molybdenum.

In cases where a solder-like finish is desired, tin, lead, bismuth, indium and their alloys can also be used.

Suitable processes for overcoating the core element include, but are not limited to: various processes involving deposition of materials out of aqueous solutions; electrolytic plating; electroless plating; chemical vapor deposition (CVD); physical vapor deposition (PVD); processes causing the deposition of materials through induced disintegration of liquid or solid precursors; and the like, all of these techniques for depositing materials being generally well known.

A PARTIALLY-OVERCOATED ELONGATE CONTACT STRUCTURE

Figure 4:
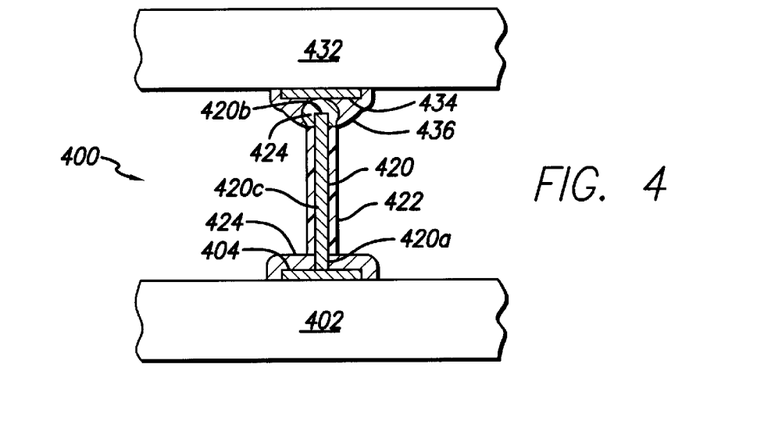
FIG. 4 is a cross-sectional view of an embodiment of a interconnection element, according to the invention.

FIG. 4 illustrates a technique of mounting an elongate partially-overcoated contact structure 400 to an electronic component 402 (compare 108). A one end 420a (compare 102a) of an elongate core element 420 (compare 102) is affixed, such as by bonding (e.g., wire bonding) to a terminal 404 (compare 112) on a surface of the electronic component 402 and is caused to be freestanding, extending from the surface of the electronic component, and is caused to have a bulbous tip 420b (compare 102b) at its free end.

The core element is suitably a gold wire, for example having a diameter of 0.7–2.0 mils, and is suitably bonded to the terminal 404 using conventional wirebonding techniques, and is suitably severed at its free end by mechanical means or electronic flame off (EFO). These techniques have been discussed in one or more of the aforementioned patent applications. The core element 420 may also be a ribbon, or flat wire, having other than a circular cross-section.

In an embodiment of the invention, the core element is a metallic (e.g., gold) wire which has an insulating coating, such as a layer 422 of polyimide, disposed on its surface.

In the process of sparking (EFO) to sever the wire, heating accompanying the sparking removes (ablates) the insulating coating 422 at selected areas of the core element 420. In this manner, an end of the supply wire is uninsulated for bonding (i.e., the end 420a to the terminal 404), and the free end (tip) 420b of the wire also becomes stripped of insulation. As illustrated, the insulating layer 422 remains intact along a substantial longitudinal central portion 402c of the wire (core element) 420 between the two ends 420a and 420b.

In this manner, a plurality of core elements 420 can be affixed to a corresponding plurality of terminals 404 on an electronic component 402.

The electronic component 402 with core elements affixed to and extending therefrom can then be placed in a plating bath so that a metallic deposit (e.g., nickel) 424 (compare 120, 122) can be formed onto (a) the exposed (uninsulated, unmasked) tip 420b of the core element and (b) the exposed (uninsulated, unmasked) base 420a of the core element, as well as onto the exposed (other than where the base 420a is bonded) surface of the terminal 404.

As illustrated in FIG. 4, in use, the distal (top, as viewed) end of the resulting contact structure 400 plated (424) tip (420b) of the contact structure 400 is brought into contact with a terminal 434 (compare 404) of another electronic component 432 (compare 402) and joined thereto with solder, braze or conductive adhesive material 436. This is a method of assembling two electronic components (402, 432) to one another. For example, memory chips (a plurality of components 402) to an interconnection substrate (432).

In the case, for example, of soldering, the typically non-wettable (with respect to solder) insulating material 422 over the central portion 420c of the elongate core element 420 prevents solder from "wicking" along the contact structure to the component 402.

By virtue of there being a metallic deposit (424) on the base (420a) of the core element (420) as well as the exposed surface of the terminal (404), the core element 420 is firmly secured to the terminal 404. Yet, the central portion of the contact structure 400, which is not overcoated with the metallic material 424 can remain yielding and compliant to "absorb" small relative movements which may occur between the components 402 and 432 once they are interconnected to one another in the manner described hereinabove.

In order to effect electroplating of a plurality of such core elements (420) extending from a plurality of such terminals (104), it is desirable to have an interim conductive layer connecting the terminals to one another (i.e., a "shorting" layer).

The insulation 422 on the core element 420 serves at least two purposes. It acts as a plating mask, so that only the two end portions of the core element (420) become plated (424). The central portion 420c of the core element 420 does not become plated. When the component 402 is soldered to another component, the insulation 422) prevents solder (not shown) from wicking up the elongate core element 420 to the electronic component 402.

It is within the scope of this invention that the distal end 420b of the core element 420 is severed by other than electronic flame off, such as by mechanical shearing, in which case it would not necessarily exhibit a ball at its distal end 420b.

It is within the scope of this invention that the insulating (polyimide) coating can be removed from the distal end of the core element 420 other than as a result of electronic flameoff. For example, the component 402 with core elements 420 attached thereto can be "inverted" and dipped into a solvent bath, the solvent dissolving the coating 422 at only a distal end portion of the core element 420.

It is within the scope of this invention that a ball can be formed (as shown) at the distal end of the core element in the same step in which the core element is severed. Alternatively, the ball can be formed in a separate step (e.g., by a second spark, or by a spark subsequent to mechanical shearing). Alternatively, no ball need be formed at the free (distal) end 420b of the core element.

The resulting elongate raised interconnection elements are well suited to be mounted to a variety of electronic components. The relatively soft core element (e.g., gold) helps eliminate fatigue when the component is mounted to another component. The masking material 122 (e.g., polyimide) acts as a "shield" when soldering the component 102 (e.g., a semiconductor device) to another component (e.g., an interconnection substrate).

AN APPLICATION FOR THE CONTACT STRUCTURES

Figure 5:
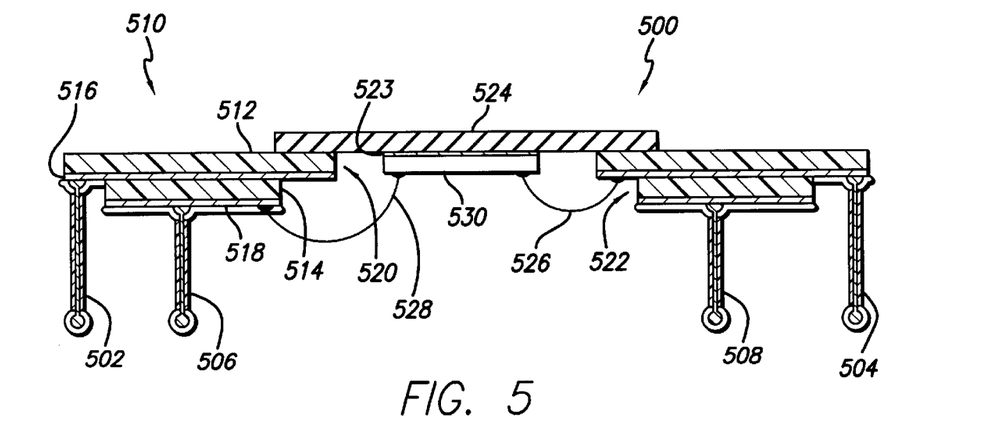
FIG. 5 is a cross-sectional view of an exemplary application for the interconnection element of the invention.

FIG. 5 (comparable to FIG. 23A of PCT/94/14909) illustrates an embodiment 500 of a semiconductor package which is based on a multi-layer substrate 510, such as a PCB substrate. Compare also FIG. 2 herein.

The multi-layer substrate 510 (compare 210) is illustrated as having two (can be more than two) insulating layers 512 (compare 212) and 514 (compare 214), the layer 512 being disposed atop (as viewed) the layer 514. The bottom surfaces of the layers 512 and 514 are provided with patterned conductive traces 516 and 518 (compare 216 and 218), respectively, in a known manner.

The top (as viewed) insulating layer 512 is formed as a ring, for example a square ring, having a central opening 520 (compare 220), and the bottom (as viewed) insulating layer 514 is also formed as a ring, having a central opening 522 (compare 222) aligned with the central opening 520. As illustrated, the top layer 512 extends beyond the outer (to the left or to the right, as viewed) edges of the bottom layer 514, and the opening 520 is smaller than the opening 522. In this manner, the conductive layer (traces) 516 of the upper layer 512 are exposed.

An electronic component 530 (compare 230) such as a semiconductor device is mounted by a die-attach material 523 (e.g., silver-filled adhesive, or silver-glass composite; compare 223) to a plate 524 (compare 224). The plate is preferably a metal plate, and is larger than the opening 520. As illustrated, the plate 524 is mounted to the layer 512, on a side of the layer opposite the conductive traces 516, with a suitable adhesive (not shown). In this manner, the semiconductor die 530 is disposed within the opening 520.

Bond wires 526 (one of many shown; compare 226) are provided between the front (bottom, as viewed) face of the semiconductor die 530 and exposed inner portions of the conductive traces 516. Likewise, bond wires 528 (one of many shown; compare 228) are provided between the front face of the semiconductor die 530 and inner portions of the conductive traces 518. This is readily accomplished with "standard" wirebonding equipment.

Raised, elongate, partially-overcoated contact structures 502 and 504 (compare 400) are mounted to exposed outer portions of the conductive traces 516. Likewise, raised elongate partially-overcoated contact structures 506 and 508 (compare 400) are mounted to outer portions of the conductive traces 518. It will be understood that each contact structure (502, 504, 506 and 508) is bonded to an individual one of a plurality of conductive traces (516, 518). In this manner, each of the conductive traces is electrically interconnected to a particular one of the bond pads on the face of the semiconductor die, via bond wires (526, 528).

In the manner described hereinabove, the contact structures 502, 504, 506 and 508 preferably extend to a common height (downward, as viewed in the figure), although the originate from different levels of the PCB 510.

In the manner described hereinabove, complex interconnections between a semiconductor die (530) and external connections (502, 504, 506, 508) suitable for mounting to a motherboard (or the like) can be effected, without requiring a package having a complex pattern of vias (layer-to-layer conductive paths) which require relatively expensive processing steps.

ANOTHER APPLICATION FOR THE INTERCONNECTION ELEMENTS

FIGS. 6A–6D, comparable to FIGS. 3A–3D of the aforementioned USSN 08/558,332 and PCT/95/14885), illustrate a technique 600 for fabricating elongate, partially-overcoated contact structures directly upon electronic components which are semiconductor devices. Also, compare FIGS. 3A-3D hereinabove.

Figure 6A:
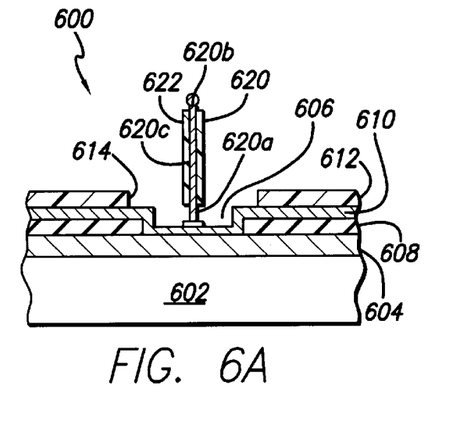
FIG. 6A is a side view of a wire having its free end bonded to a metal layer applied to a substrate, through an opening in a photoresist layer, according to the invention.

According to conventional semiconductor processing techniques, a semiconductor device 602 (compare 302) has a patterned conductive layer 604 (compare 304). This layer 604 may be a top metal layer, which is normally intended for bond-out to the die, as defined by openings 606 (compare 306) in an insulating (e.g., passivation) layer 608 (compare 308) which is typically nitride. In this manner, a bond pad would be defined which would have an area corresponding to the area of the opening 606 in the passivation layer 608. Normally (i.e., according to the prior art), a wire would be bonded to the bond pad.

A layer 610 (compare 310) of metal material (e.g., aluminum) is deposited (such as by sputtering) over the passivation layer 608, and makes contact with the layer 604 within the opening 606.

A patterned layer 612 (compare 312) of masking material (e.g., photoresist) is applied over the layer 610 with openings 614 aligned over the openings 606 in the passivation layer 608.

Portions of the conductive layer 610 are covered by the masking material 612, other portions of the conductive layer 610 are exposed (not covered) within the openings 614 of the layer of masking material 312. The exposed portions of the conductive layer 610, within the openings 614 will serve as "pads" or "terminals" (compare 314), and may be gold plated (not shown).

An important feature of this technique is that the opening 614 is larger than the opening 606. As will be evident, this will result in a larger bond area (defined by the opening 614) than is otherwise (as defined by the opening 606) present on the semiconductor die 602.

An end 620*a* of a core element (wire stem) 620 is bonded to the top (as viewed) surface of the conductive layer 610, within the opening 614. The core element 620 is elongate, and extends (vertically, as shown) from the surface of the component 602 and is severed to have a free end (tip) 620*b*, in the manner described hereinabove (e.g., by electronic flame off). The core element is suitably a gold wire having a diameter of 0.7–2.0 mils and a length (vertical, as viewed) of 40–60 mils.

In the case of starting with an insulated wire 620, the two ends 620*a* and 620*b* of the wire 620 are bare, and a central portion 620*c* of the wire 620 is covered with an insulating material 622.

In the case of starting with a bare wire 620, an insulating (masking) material may be applied over the central portion 620*c* of the wire 620. This may be done, for example, by applying a masking material over the entire wire 620, then removing the masking material from the two end portions of the wire by laser ablation, or the like.

Figure 6B:
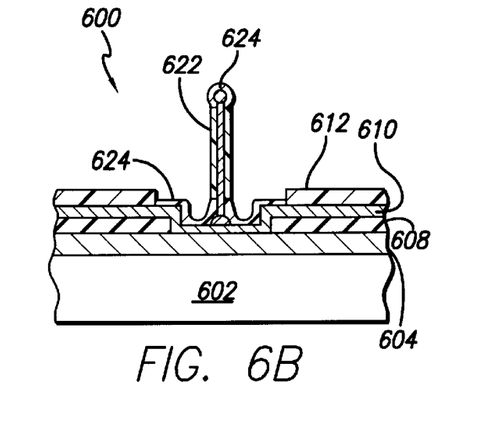
FIG. 6B is a side view of the substrate of FIG. 6A, with the wire overcoated, according to the invention.

Next, as shown in FIG. 6B, the core element 620 is overcoated with one or more layers of conductive material 624, in the manner described hereinabove. In FIG. 6B it can be seen that the conductive material 624 covers a portion of the core element 620 adjacent the proximal (bonded) end 620*a* of the core element 620, as well as the exposed surface of the conductive layer 610 within the area defined by the opening 614 in the photoresist 612, and also covers a portion of the core element adjacent the distal (free) end 620*b* of the core element 620.

The photoresist 612 is then removed (such as by chemical etching, or washing), and the substrate is subjected to selective etching (e.g., chemical etching) to remove all of the material from the conductive layer 610 except that portion 615 (e.g., pad, terminal) of the layer 610 which is covered by the material 324 overcoating the core element 620. Portions of the conductive layer 610 previously covered by the masking material 612, and not overcoated with the material 624, are removed in this step, while the remaining portions of the conductive material 610 which have been overcoated by the material 624 are not removed. This results in the structure shown in FIG. 6C, a significant advantage of which is that the resulting composite interconnection element 630 is securely anchored (by the coating material 624) to an area (which was defined by the opening 614 in the photoresist 612) which can easily be made to be larger than what would otherwise (e.g., in the prior art) be considered to be the contact area of a bond pad (i.e., the opening 606 in the passivation layer 608).

Figure 6C:
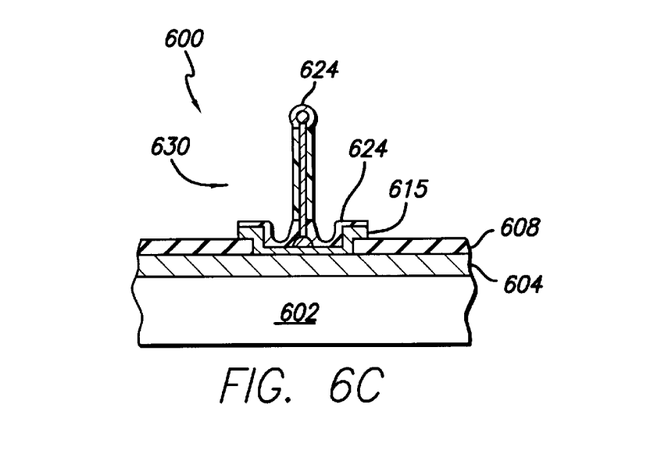
FIG. 6C is a side view of the substrate of FIG. 6B, with the photoresist layer removed and the metal layer partially removed according to the invention.

An important feature of this technique is that the conductive layer 610 may function as a "shorting" layer to protect the device 302 from damage during a process of electronic flame off (EFO) of the core element 620. The conductive layer 610 would also be useful in overcoating the core element 620 by an electroplating process.

Another important advantage of this technique is that a hermetically-sealed (completely overcoated) connection is effected between the elongate interconnection element 630 and the terminal (pad) 615 to which it is mounted.

Generally, the partially-overcoated contact structures of the present invention are readily mounted to (or fabricated upon) a substrate (particularly a semiconductor die) in a manner in which the tips (e.g., 620*b*) of the interconnection elements (e.g., 630) are readily caused to be coplanar with one another.

It is also useful to create openings in the resist (e.g., 314) at locations whereat contact structures are not mounted. Rather, such openings could advantageously be employed to effect connections (such as by traditional wirebonding) to other pads on the same semiconductor die or on other semiconductor dies. This affords the manufacturer the ability to "customize"(route) interconnections with a common layout of openings in the resist.

It is within the scope of this invention that a conductive layer (610) is not first applied to the component prior to mounting the elongate core element 620 thereto. For example, the proximal end (620*al*) of the core element (620) can be bonded directly to a bond pad terminal of a semiconductor device electronic component, and can be overcoated using an electroless plating process to cover the unmasked portions of the elongate core element and adjacent area of the semiconductor device bond pads.

In each and every embodiment of contact structures disclosed and described herein, it is within the scope of this invention that a plurality of such contact structures can be mounted to a corresponding plurality of terminals on an electronic component. It is also clearly within the scope of this invention that the electronic component can be one of many unsingulated semiconductor devices resident on a semiconductor wafer.

Figure 6D:
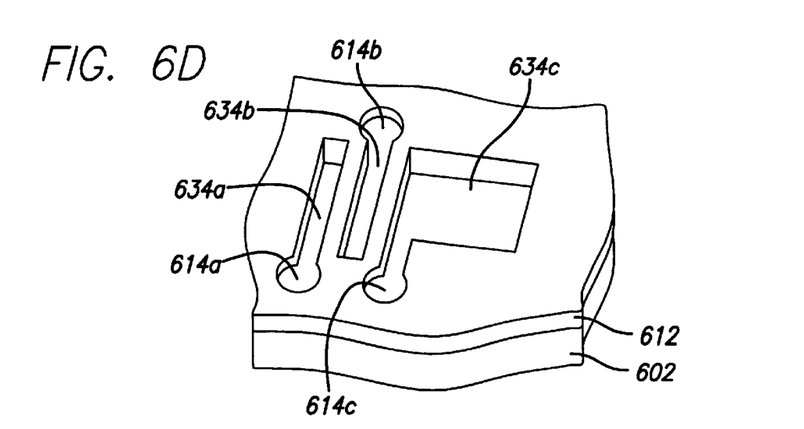
FIG. 6D is a perspective view of a semiconductor device, formed according to the techniques set forth in FIGS. 3A–3C, according to the invention.

As shown in FIG. 6D, it is within the scope of this invention that the masking layer 612 can additionally be patterned, so as to leave additional conductive lines or areas upon the face of the semiconductor device 602 (i.e., in addition to providing openings 614 whereat the interconnection elements 630 are mounted and overcoated). This is illustrated in the figure by the "elongate" openings 634*a* and 634*b* extending to the openings 614*a* and 614*b*, respectively, and the "area" opening 634*c* optionally (as shown) extending to the opening 614*c*. (In this figure, elements 604, 608 and 610 are omitted, for illustrative clarity.) As set forth hereinabove, the overcoat material 624 will be deposited in these additional openings (634*a*, 634*b*, 634*c*), and will prevent portions of the conductive layer 610 underlying these openings from being removed. In the case of such elongated and area openings (634*a*, 634*b*, 634*c*) extending to contact openings (614*a*, 614*b*, 614*c*), the elongated and area openings will be electrically connected to corresponding ones of the contact structures. This is useful in the context of providing (routing) conductive traces between (interconnecting) two or more terminals (615) directly upon the face of the electronic component (e.g., semiconductor device) 602. This is also useful for providing ground and/or power planes directly upon the electronic component 602. This is also useful in the context of closely adjacent (e.g., interleaved) elongated areas (which when plated, become lines), such as the elongated areas 634*a* and 634*b*, which can serve as on-chip (602) capacitors. Additionally, providing openings in the masking layer 612 at other than the locations of the contact structures 630 can help uniformize deposition of the subsequent overcoat material 624.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

For example, although the contact structures of the present invention (FIGS. 4,5,6) have been shown as being straight and normal (ninety degrees) to the surface of the component to which they are mounted, they can be straight and inclined (at a non-normal angle) to the surface of the component. Also, they may be shaped in any suitable manner so that, for example, their distal (free) ends are spaced farther apart than their proximal (bonded) ends.

For example, the core elements can be fully overcoated with metallic material which is subsequently selectively removed from the central portions of the core elements, leaving the proximal and distal portions of the core elements overcoated with metallic material. Or, after fully overcoating the core elements with metallic material, the metallic material can be removed from all but the distal portions of the core elements.

For example, the contact structures of the present invention (FIGS. 4,5,6) can be subjected to a heat treatment after they are fabricated, such as to anneal the material of the core elements and/or the metallic materials overcoating the core elements.

What is claimed is:

1. A free standing, resilient elongate contact structure mounted to an electronic component having a surface and a terminal adjacent the surface, comprising:
   an elongate core element having a terminal end, a contact end opposite the terminal end, and a central portion connecting the terminal end and the contact end, the elongate core element bonded to the terminal at the terminal end; and
   a metallic material
      deposited on and covering the terminal end of the elongate core element and an area of the terminal adjacent the terminal end,
      deposited on and covering the contact end of the elongate core element prior to contact or connection of the contact end with a second electronic component or substrate, and
      not covering the central portion of the elongate core element.

2. The free standing resilient contact structure according to claim 1, wherein the metalic material is selected from the group nickel and nickel alloys.

3. The free standing, resilient elongate contact structure, according to claim 1 further comprising a plurality of the elongate contact structures and a plurality of the terminals, wherein the electronic component comprises a multilayer interconnection substrate and the plurality of the elongate contact structures are bonded at respective first ends to the plurality of the terminals on the multilayer interconnection substrate.

4. The free standing, resilient elongate contact structure, according to claim 1 further comprising a plurality of the elongate contact structures and a plurality of the terminals, wherein the electronic component comprises a semiconductor device and the plurality of the elongate contact structures are bonded at respective first ends to the plurality of the terminals on the semiconductor device.

5. A contact structure comprising:
   an elongate core element, of a first material, having a terminal end, a contact end opposite the terminal end, a terminal end portion adjacent the terminal end, a contact end portion adjacent the contact end, and a central portion connecting the terminal end and the contact end,
   a masking material covering the central portion; and
   a metallic material deposited on and covering the contact end and the contact end portion of the elongate core element;
   wherein the metallic material is more resilient than the elongate core element.

6. A contact structure, according to claim 5, further comprising: the metallic material deposited on and covering the terminal end portion.

7. A contact structure according to claim 5, wherein the metallic material is selected from the group nickel and nickel alloys.

8. An elongate contact structure mountable on a terminal of an electronic component comprising:

an elongate core element which is of a plateable, flexible material, the elongate core element having a terminal end, a contact end opposite the terminal end, a first plateable portion commencing at the terminal end and extending towards the contact end, a second plateable portion commencing at the contact end and extending towards the terminal end, and a central non-plateable portion between the first and second plateable portions;

a masking material disposed on the central portion; and an overcoat material deposited on and covering the contact end and the second plateable portion, wherein the overcoat material is more resilient than the elongate core element.

9. An elongate structure according to claim 8, further comprising:

an overcoat material deposited on and covering the terminal end and the first plateable portion.

10. An elongate structure according to claim 9, further comprising: an overcoat material deposited on the terminal of the electronic component.

* * * * *